US010641855B2

(12) United States Patent
Pendse et al.

(10) Patent No.: US 10,641,855 B2
(45) Date of Patent: May 5, 2020

(54) METHODS FOR MITIGATING LOCAL SAR HOTSPOTS AND FLIP ANGLE UNIFORMITY IN ULTRA-HIGH FIELD SIMULTANEOUS MULTISLICE IMAGING USING PARALLEL TRANSMISSION

(71) Applicant: The Board of Trustees of the Leland Stanford Junior University, Palo Alto, CA (US)

(72) Inventors: Mihir Pendse, Fremont, CA (US); Brian Rutt, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 62 days.

(21) Appl. No.: 15/800,831

(22) Filed: Nov. 1, 2017

(65) Prior Publication Data

US 2018/0120398 A1 May 3, 2018

Related U.S. Application Data

(60) Provisional application No. 62/416,396, filed on Nov. 2, 2016.

(51) Int. Cl.
*G01V 3/00* (2006.01)
*G01R 33/483* (2006.01)
(Continued)

(52) U.S. Cl.
CPC ....... *G01R 33/4835* (2013.01); *G01R 33/288* (2013.01); *G01R 33/5612* (2013.01); *G01R 33/5659* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS 7,046,003 B2    3/2006  Hargreaves et al.
2013/0300414 A1*  11/2013  Guerin ................. G01R 33/288
                                                     324/309

(Continued)

*Primary Examiner* — Walter L Lindsay, Jr.
*Assistant Examiner* — Frederick Wenderoth
(74) *Attorney, Agent, or Firm* — Lumen Patent Firm

(57) ABSTRACT

Obtaining minimum duration parallel transmit pulses for simultaneous multislice imaging that includes minimizing specific absorption rate hotspots, using an IMPULSE pTx optimization method to determine multiple spoke locations and multiple channel weights for multiple slices while enforcing a specified flip angle inhomogeneity tolerance over the multiple slices when excited, applying a control algorithm to conform a simultaneous multislice (SMS) pulse to the excited multiple slices to minimize a cost function having terms corresponding to an excitation accuracy and a pulse power, where a regularization term in the cost function is configured by the control algorithm for excitation accuracy while limiting a peak pulse power, and applying a time-optimal variable rate selective excitation (VERSE) to enforce a peak power constraint with a minimum pulse duration by reshaping a RF waveform and a gradient waveform without altering an excitation profile if the peak power limit on a channel is exceeded.

3 Claims, 6 Drawing Sheets

(51) Int. Cl.
  *G01R 33/28*   (2006.01)
  *G01R 33/565*   (2006.01)
  *G01R 33/561*   (2006.01)

(58) Field of Classification Search
  USPC .......................................................... 324/309
  See application file for complete search history.

(56) References Cited

U.S. PATENT DOCUMENTS

2015/0323631 A1* 11/2015 Asslaender ........ G01R 33/4616
                                                            324/309
2015/0362574 A1* 12/2015 Wu .................... G01R 33/4835
                                                            324/322
2016/0128574 A1    5/2016 Rutt et al.

* cited by examiner

IMPULSE-SMS y = -7.00 cm y = -4.20 cm y = -1.40 cm y = 1.40 cm y = 4.20 cm y = 7.00 cm

Minimizing specific absorption rate (SAR) hotspots, using an IMPULSE pTx optimization method with a magnetic resonance imaging system

Applying a control algorithm to conform a simultaneous multislice (SMS) pulse to said excited multiple slices to minimize a cost function having terms corresponding to an excitation accuracy and a pulse power

Applying a time-optimal variable rate selective excitation (VERSE) to enforce a peak power constraint with a minimum pulse duration by reshaping a RF waveform and a gradient waveform without altering an excitation profile if the peak power limit on a channel is exceeded

*FIG. 4*

METHODS FOR MITIGATING LOCAL SAR HOTSPOTS AND FLIP ANGLE UNIFORMITY IN ULTRA-HIGH FIELD SIMULTANEOUS MULTISLICE IMAGING USING PARALLEL TRANSMISSION

CROSS-REFERENCE TO RELATED APPLICATIONS

This application claims priority from U.S. Provisional Patent Application 62/416,396 filed Nov. 2, 2016, which is incorporated herein by reference.

FIELD OF THE INVENTION

The present invention relates generally to magnetic resonance imaging, particularly to simultaneous multislice imaging at ultra-high magnetic field strengths.

BACKGROUND OF THE INVENTION

Increasing main magnetic field strength in MRI improves image quality by increased polarization of the magnetic spins, which results in improved signal-to-noise ratio (SNR) and/or spatial resolution. Simultaneous multislice (SMS) acquisition is a promising technique for reducing acquisition time by exciting multiple slices simultaneously and resolving them during reconstruction thus allowing for reduced scan time or increased slice coverage.

One of the main challenges with simultaneous multislice imaging involves the peak RF power that often exceeds amplifier limits due to summation of subpulses from multiple slices. There are several strategies for addressing this peak power problem including optimizing the phases of the individual subpulses, shifting the pulses in time before summing so the peaks don't overlap, and "root-flipping." Recently, this problem was tackled in the framework of an optimal control problem by minimizing a cost function that includes a term for excitation accuracy and another term penalizing the pulse power.

By integrating forwards and backwards in time through use of a Bloch equation simulator to calculate this cost function and its derivatives, a minimum could be found by optimizing the RF and gradient waveforms. This method was shown to achieve better multiband factors than prior approaches.

At higher field strengths B1+ inhomogeneity and local SAR concerns become increasingly problematic and therefore parallel transmission is used where several transmitters with independently controllable amplitude and phase are used to achieve flip angle homogeneity and mitigate local SAR hotspots. For slice selective excitation, a spokes excitation k-space trajectory is used where multiple spokes are applied along the kz direction for different locations in the kx-ky plane. The waveform shape will control the slice profile while the choice of kx, ky values for the spokes locations can be used to optimize the flip angle homogeneity in addition to the choice of amplitude and phase on each transmit channel. In addition to reducing flip angle inhomogeneity, the amplitudes and phases of the transmit channels should be chosen to suppress local SAR hotspots.

The IMPULSE method has been shown to be an effective way to optimize parallel transmit pulses for sequential multislice excitation in a SAR aware manner by using a distributed optimization algorithm (alternating direction method of multipliers, ADMM) to decompose the problem in such a way that allows the subproblems to be solved efficiently without the need for compressing local SAR matrices which is a drawback of most other pTx design algorithms.

Finally, if the peak power still violates the peak power limit even with these optimized waveforms, a time-optimal VERSE algorithm is used to enforce the peak power limit for the pulse with minimum duration.

What is needed is a method for designing pTx-SMS pulses to achieve uniform flip angle maps and mitigate local SAR hotspots while exciting multiple slices simultaneously.

SUMMARY OF THE INVENTION

To address the needs in the art, a method of obtaining minimum duration parallel transmit pulses for simultaneous multislice imaging is provided that includes minimizing specific absorption rate (SAR) hotspots, using an IMPULSE pTx optimization method with a magnetic resonance imaging system, to determine multiple spoke locations and multiple channel weights for multiple slices while enforcing a specified flip angle inhomogeneity tolerance over the multiple slices when excited, applying a control algorithm to conform a simultaneous multislice (SMS) pulse to the excited multiple slices to minimize a cost function having terms corresponding to an excitation accuracy and a pulse power, where a regularization term in the cost function is configured by the control algorithm for excitation accuracy while limiting a peak pulse power, and applying a time-optimal variable rate selective excitation (VERSE) to enforce a peak power constraint with a minimum pulse duration by reshaping a RF waveform and a gradient waveform without altering an excitation profile if the peak power limit on a channel is exceeded.

In one aspect of the invention, a subpulse to excite each slice is designed with a control algorithm to minimize total peak pulse power.

In another aspect of the invention, the time-optimal VERSE algorithm increases a pulse duration to achieve a previous excitation-kspace coverage, where the increase in duration of the pulse until the peak power constraint is met.

BRIEF DESCRIPTION OF THE DRAWINGS

FIG. 4 shows a flow diagram of one embodiment of the invention.

DETAILED DESCRIPTION

Described herein is a procedure for obtaining minimum duration parallel transmit pulses for simultaneous multislice imaging. The current invention uses a combination of the IMPULSE parallel transmit pulse design algorithm for mitigating local SAR hotspots and enforcing flip angle homogeneity; an optimal control algorithm for intelligent design of slice selective subpulse shape with minimum power; and time-optimal VERSE for reducing peak power with minimum increase in pulse duration. Results indicate a reduction in pulse duration by a factor of 4.9 compared to a pTx-SMS pulse design with conventional techniques. Patent applicant Ser. No. 14/539,552 teaches the IMPULSE parallel transmit pulse design algorithm, and is incorporated by reference herein in its entirety. Patent application Ser. No. 10/945,670 teaches the time-optimal VERSE for reducing peak power with minimum increase in pulse duration, and is incorporated by reference herein in its entirety.

Simultaneous multislice (SMS) imaging is a rapidly developing technique for reducing acquisition time by a factor equal to the number of simultaneously excited slices. Although SMS results in improved SNR for comparable acceleration factors compared to in-plane parallel imaging, it also results in higher pulse power that can violate hardware power limits for higher multiband (MB) factors. The pulses typically need to be stretched in order to reduce the pulse power at the expense of increased duration. When combining SMS imaging with parallel transmission (pTx) to achieve flip angle homogeneity and mitigation of local SAR hotspots at high fields, the problem of long duration is amplified because pTx pulses are inherently long due to the need for 3D excitation k-space trajectories. The current invention provides an extension of the IMPULSE pTx design algorithm to enable simultaneous multislice (SMS) excitation with acceptable pulse durations. Provided herein is a strategy for integrating the optimal control method for reducing peak power in SMS with the optimization of pTx channel weightings as well as using a time-optimal VERSE algorithm to enforce peak power limits with minimum duration. Desirable features of IMPULSE, including the ability to optimize spoke locations and to design pulses without SAR compression, are retained in this extension. Further, it is demonstrated that, even for large multiband acceleration factors, the current invention enables design of pTx pulses that minimize local SAR while achieving acceptable in-slice homogeneity under strict peak power constraints.

Figure 1:
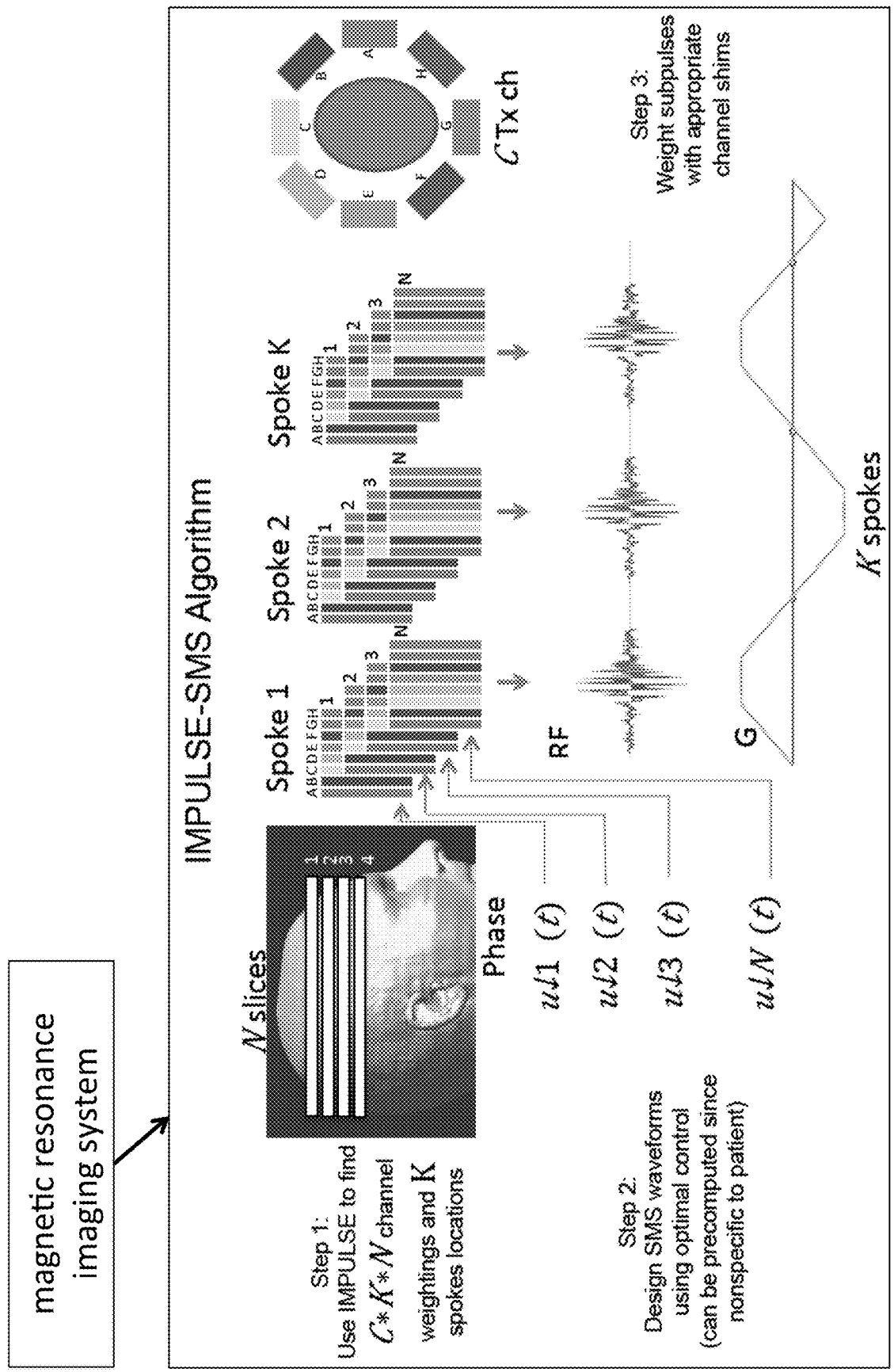
FIG. 1 shows each subpulse waveform $u_{\downarrow}i(t)$ is found using the optimal control algorithm to minimize the total peak pulse power. These waveforms are used to construct the system matrix for pTx pulse design. During the pTx pulse design a total of C*K*N channel weightings and the spokes locations are optimized, where at each spoke, the amplitude and phase of each $u_{\downarrow}i(t)$ is adjusted by the corresponding channel weight before summing the N waveforms to get the combined SMS waveform, according to the current invention.

As with the original IMPULSE algorithm, one seeks a minimum SAR pulse that satisfies an excitation accuracy tolerance over the excited slices. In the case of SMS, the slices share a single excitation k-space trajectory but still have different channel weightings. As shown in FIG. 1, each subpulse waveform at each channel is weighted by a complex value before summing to get the composite pTx-SMS pulse. Thus the problem can be formulated as follows:

$$\text{MINIMIZE: } SAR_{normalized} = \max_{r=1,\ldots,N_R} \left( \sum_{k=1}^{N_K} b_k^H R_r b_k \right)$$

$$FAI_{SMS} = \sum_{n=1}^{N} \left\| \sum_{c,k} A_{c,k}^{(n)} b_{c,k}^{(n)} - d^{(n)} \right\|_2^2 \leq \varepsilon$$

Here, the objective function is a normalized SAR quantity over all $R_r$ matrices, which represent a SAR matrix normalized by its corresponding constraint (eg. 10 W/kg for local SAR or 3.2 W/kg for global SAR) and $b_k$ is the channel weighting vector at a single spoke and slice. In this way, $SAR_{normalized}$ represents the factor by which the duty cycle can be scaled while still satisfying the local SAR constraint. This headroom achieved by finding the minimum SAR pulse can be exchanged for increased duty cycle, which could correspond to reduced acquisition time or increased SNR/resolution. This minimization is subject to a constraint on the total excitation error ($\varepsilon$) over all slices characterized by a block diagonal system matrix A that contains the individual system matrix for each slice in every block and a target vector d corresponding to a concatenation of the target vectors for individual slices. In this way, SMS pTx design problem is identical to the original pTx design problem except that A and b are larger and contain channel weightings for all slices. Therefore, the same IMPULSE algorithm can be used to find the channel weightings and spokes locations for the simultaneous multislice excitation without any need for compression of SAR matrices.

While IMPULSE minimizes local and global SAR it does not minimize peak pulse power. In order to minimize this quantity, the waveform shapes of each of the subpulses to excite the different slices at different frequencies must be optimized. This can be done in an optimal control framework by minimizing the following:

$$J(M, u) = \sum_{i=1}^{N} \int |M_i(T; z) - M_{d,i}(z)|_2^2 dz + \frac{\alpha}{2} \int_0^{T_u} \left| \sum_{i=1}^{N} u_i(t) \right|_2^2 dt$$

Here $M_i$ (T; z) is the excited slice profile for the current iteration, $M_{d,i}$ (z) is the desired excitation profile, $u_1$ (t) is the subpulse waveform for each slice, and $\alpha$ is the regularization term that controls the importance of pulse power. Minimizing this function in the optimal control framework involves specifying a duration for the u(t) waveform and a time step for discretization. Then, u(t) is initialized to some value such as zero and the corresponding initial magnetization is found. At each iteration, a forward and backward pass through the Bloch equation is performed to get the gradient and Hessian of the excited magnetization as a function of u which can be used to update u to reduce the objective.

For large multiband factors and flip angles, even this optimization will not reduce the peak power enough to meet the amplifier limit. If this is the case, the composite SMS pulse (formed by combining the individual waveforms with the optimized channel weightings) will need to be stretched in order reduce the peak power. Rather than naively stretching both the gradient and RF waveforms while maintaining the k-space trajectory, a shorter duration can be achieved using a time-optimal VERSE algorithm as follows. Do the following for each channel:
 1. Instead of representing the RF waveform and k-space trajectory as a function of t (time) represent it as a function of s, the total distance travelled in k-space.

This is possible because the spokes trajectory does not visit the same location more than once.

2. Find an upper bound on the gradient strength for each s, which is found as the minimum of the hardware gradient strength limit and the peak RF limit normalized by the kspace weighting of the design pulse for each s.

3. Reshape the gradient waveform to have minimum duration while satisfying the upper bound in (2) and slew rate constraints.

4. Find the RF waveform that achieves the original k-space weighting with the new gradient waveform The performance of the IMPULSE-SMS algorithm was demonstrated by designing pTx pulses using simulated B1+ and electric field maps found through full-wave FDTD simulations with an 8-channel pTx head coil model designed in Sim4Life™ and the Duke™ body models from the Virtual Family. To get B1+ and E field maps, simulations were done with a harmonic excitation at 298 MHz (corresponding to the 7T Larmor frequency) with each channel of the coil excited independently. Both the optimal control algorithm and the pTx optimization were implemented in MATLAB™. For the optimal control algorithm, a GPU kernel was used to perform the forward and backward integrations of the Bloch equations. Convergence of the optimal algorithm took approximately 10 minutes. Since this optimization is independent of the patient's B1+ or SAR information, this long computation time is considered acceptable since it can be precomputed prior to the scan.

The excitations with small flip angles (10 degrees) were considered first, where VERSE was not needed to enforce the peak power limit. This involved exciting two axial slices spaced 6 cm apart and 6 axial slices spaced 2 cm apart. In this example case, since the pulse shape is not being changed, it is possible to include B0 inhomogeneity information into the system matrix. Then a more demanding case with a flip angle of 60 degrees to excite 6 coronal slices is considered. Here it was necessary to apply the time optimal VERSE algorithm to stretch the pulse to enforce the peak power constraint. Here, it is assumed that no B0 inhomogeneity in designing the system matrix since the pulse duration is not fixed so the influence of B0 effects is not known beforehand. Compared is the method of the current invention to a conventional pTx-SMS design algorithm that does not account for SAR, does not optimize spoke locations, does not optimize the subpulse waveforms, and does not use time-optimal VERSE for stretching.

Figure 2A:
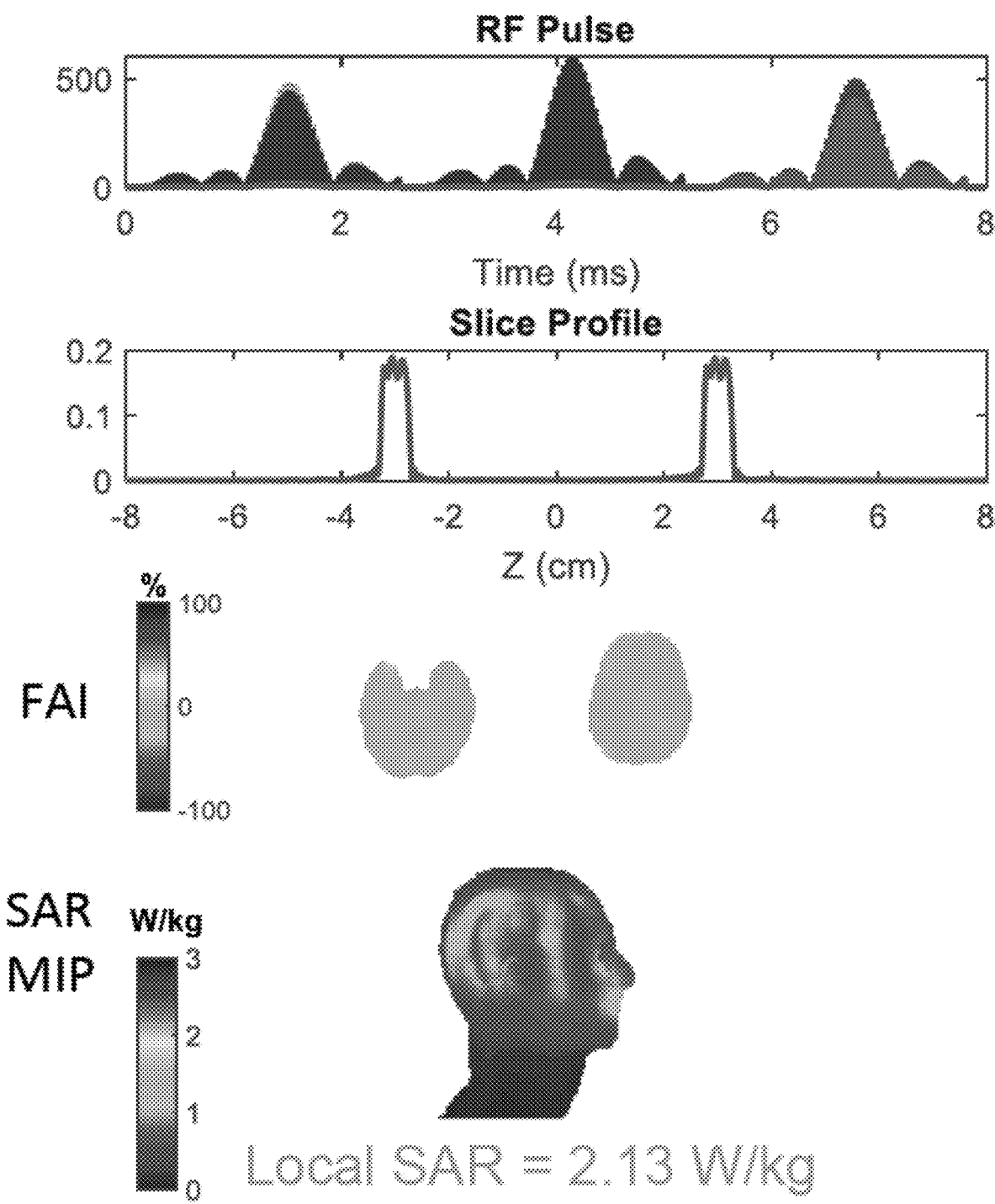
FIGS. 2A-2B show an example of a low flip angle (10 degrees) design case where applying the time-optimal VERSE algorithm was not needed to meet the local SAR constraint within a reasonable pulse duration (8 ms), (2A) is the design of two slices spaces 6 cm apart and (2B) is the design of 6 slices separated 6 cm apart, according to embodiments of the current invention.
Figure 2B:
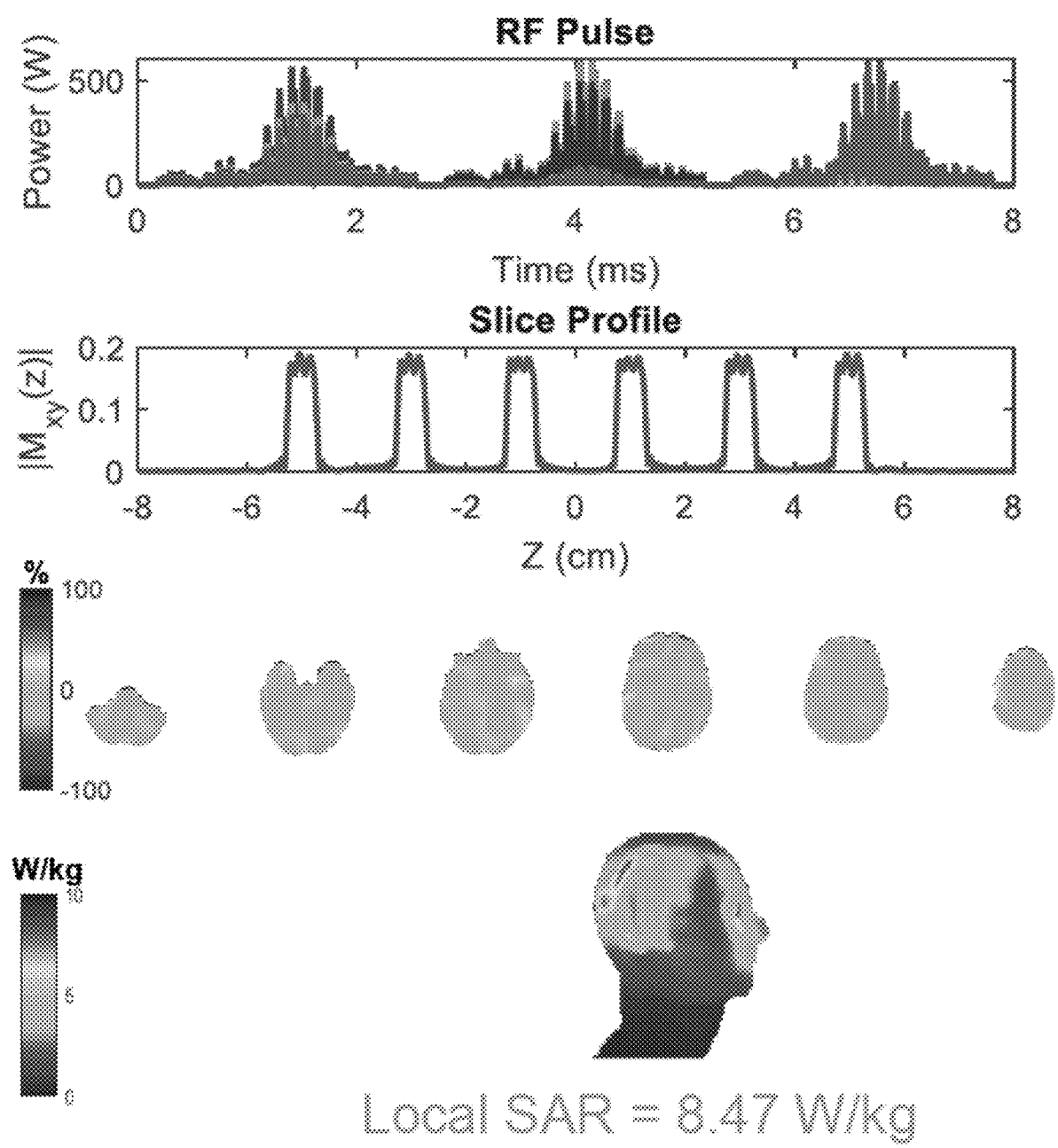

As seen in FIGS. 2A-2B, IMPULSE-SMS was used to achieve uniform flip angles and an accurate slice profile without significant SAR hotspots. For the cases in these figures, with a flip angle of only 10 degrees it wasn't necessary to perform any stretching to satisfy the peak RF limit. For the case with two slices spaced 6 cm apart and a flip angle inhomogeneity tolerance of 5%, a local SAR of 2.13 W/kg was achieved, as shown in FIG. 2A. For the case with six slices spaced 2 cm apart and a flip angle inhomogeneity tolerance of 10%, a local SAR of 8.47 W/kg was achieved, as shown in FIG. 2B.

Figure 3A:
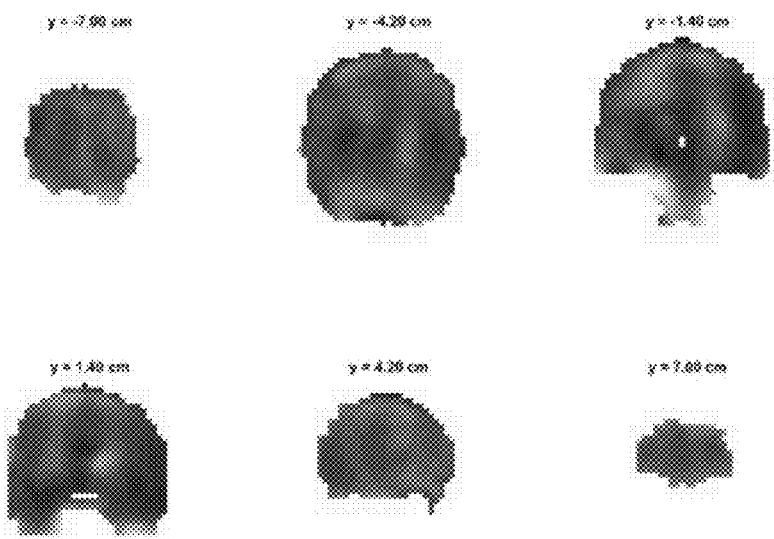
FIGS. 3A-3B show (3A) the pulse to excite 6 coronal slices with 60 degree flip angle and 7% flip angle inhomogeneity tolerance with a basic pTx-SMS pulse design without accounting for local SAR in the pTx optimization, without optimizing the subpulse waveforms, and with naive stretching to enforce the peak power constraint, and (3b) a pulse to achieve the same excitation specification designed using IMPULSE-SMS with time-optimal VERSE for pulse stretching, according to the current invention.
Figure 3A:
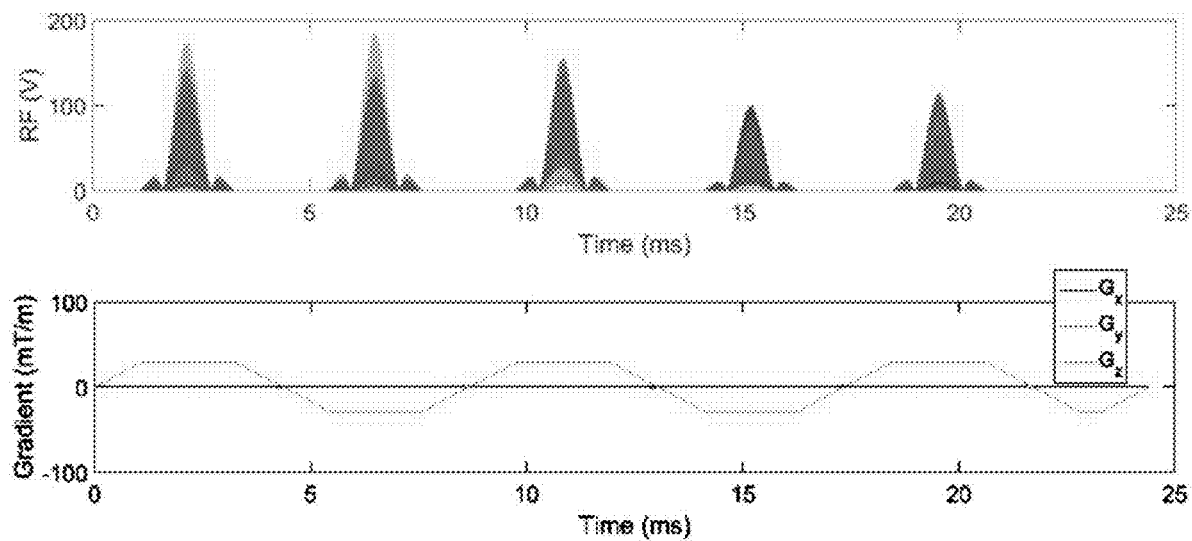
Figure 3B:
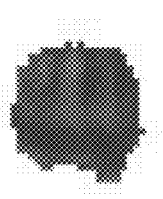
Figure 3B:
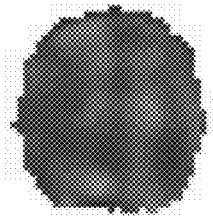
Figure 3B:
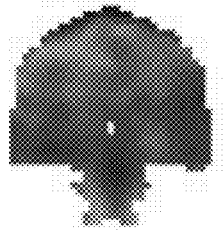
Figure 3B:
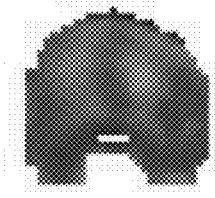
Figure 3B:
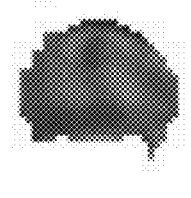
Figure 3B:
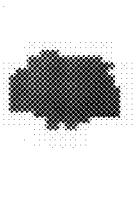
Figure 3B:
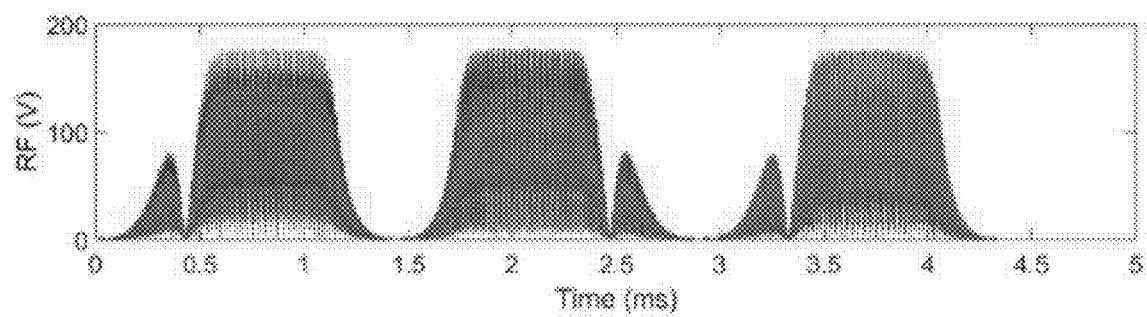
Figure 3B:
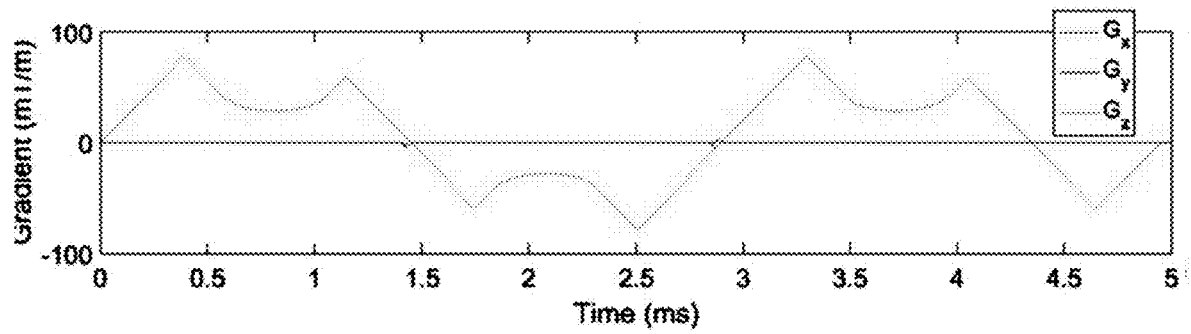

As shown in FIGS. 3A-3B, the design of a pTx-SMS pulse to excite 6 slices with a 60 degree flip angle and 7% flip angle inhomogeneity tolerance using a conventional design algorithm results in a long pulse (25 ms) that would not be usable in practice. With IMPULSE-SMS, the pulse achieves the same excitation accuracy constraints with a duration that is about a factor of 5 less. This pulse with 5 ms duration would be usable in a scan.

FIG. 4 shows a flow diagram of one embodiment of the invention, where the steps include minimizing specific absorption rate (SAR) hotspots, using an IMPULSE pTx optimization method with a magnetic resonance imaging system, applying a control algorithm to conform a simultaneous multislice (SMS) pulse to said excited multiple slices to minimize a cost function having terms corresponding to an excitation accuracy and a pulse power, and applying a time-optimal variable rate selective excitation (VERSE) to enforce a peak power constraint with a minimum pulse duration by reshaping a RF waveform and a gradient waveform without altering an excitation profile if the peak power limit on a channel is exceeded.

Provided herein is a method for designing pTx-SMS pulses to achieve uniform flip angle maps and mitigate local SAR hotspots while exciting multiple slices simultaneously. Subject to several constraints on gradients (slew rate and max strength), RF (peak instantaneous and average power per channel), patient safety (local and global SAR), and excitation accuracy (slice profile and flip angle inhomogeneity), the pulse designed with IMPULSE-SMS will have minimum duration.

There are a few considerations with the algorithm. Firstly, since the duration of the pulse is changed with the time-optimal VERSE algorithm, the current formulation doesn't incorporate B0 inhomogeneity into the design because this would require a fixed pulse duration. However, the reduction of pulse duration to under 5 ms using the time optimal VERSE approach ensures that the pulses are short enough to be robust to B0 effects. Additionally, the VERSE waveforms is inclined to be very sensitive to timing errors and therefore very precise RF and gradient hardware would be needed to implement these pulses.

The described IMPULSE-SMS algorithm according to the current invention gives a computationally efficient method for designing pTx RF pulses with short duration even for larger multiband factors and larger flip angles that will be usable in human imaging. These pulses are guaranteed to satisfy flip angle inhomogeneity and local SAR constraints thus ensuring acceptable excitation accuracy and managing the safety risk from tissue heating.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example, this same methodology could be used for much higher channel count and multirow arrays to achieve higher multiband factors through because the increased number of degrees of freedom enable better control of B1 and local SAR as well as improving performance of the SMS reconstruction.

All such variations are considered to be within the scope and spirit of the present invention as defined by the following claims and their legal equivalents.

What is claimed:

1. A method of obtaining minimum duration parallel transmit pulses for simultaneous multislice imaging, comprising:

a) minimizing specific absorption rate (SAR) hotspots, using an IMPULSE pTx optimization method with a magnetic resonance imaging system, to determine multiple spoke locations and multiple channel weights for multiple slices while enforcing a specified flip angle inhomogeneity tolerance over said multiple slices when excited;

b) applying a control algorithm to conform a simultaneous multislice (SMS) pulse to said excited multiple slices to minimize a cost function having terms corresponding to an excitation accuracy and a pulse power, wherein a regularization term in said cost function is configured by said control algorithm for excitation accuracy while limiting a peak pulse power; and c) applying a time-optimal variable rate selective excitation (VERSE) to enforce a peak power constraint with a minimum pulse duration by reshaping a RF waveform and a gradient waveform without altering an excitation profile if the peak power limit on a channel is exceeded.

2. The method according to claim 1, wherein a subpulse to excite each said slice is designed with a control algorithm to minimize total peak pulse power.

3. The method according to claim 1, wherein said time-optimal VERSE algorithm increases a pulse duration to achieve a previous excitation-kspace coverage, wherein said increase in duration of said pulse until said peak power constraint is met.

* * * * *